United States Patent [19]

Matsuda

[11] Patent Number: 4,724,475
[45] Date of Patent: Feb. 9, 1988

[54] SEMICONDUCTOR DEVICE
[75] Inventor: Hideo Matsuda, Yokohama, Japan
[73] Assignee: Kabushiki Kaisha Toshiba, Kawasaki, Japan
[21] Appl. No.: 871,145
[22] Filed: Jun. 3, 1986

Related U.S. Application Data

[63] Continuation of Ser. No. 561,976, Dec. 16, 1983, abandoned.

[30] Foreign Application Priority Data

Dec. 28, 1982 [JP] Japan ................... 57-227378

[51] Int. Cl.⁴ ............... H01L 23/42; H01L 23/44; H01L 23/46
[52] U.S. Cl. .................. 357/79; 357/80; 357/71
[58] Field of Search .............. 357/79, 80, 65, 67, 357/71

[56] References Cited

U.S. PATENT DOCUMENTS 4,155,155  5/1979  Bourdon et al.
4,176,443 12/1979  Iannuzzi et al. ............ 357/71
4,321,612  3/1982  Murata et al. ............. 357/71

Primary Examiner—William L. Sikes
Assistant Examiner—Robert E. Wise
Attorney, Agent, or Firm—Finnegan, Henderson, Farabow, Garrett & Dunner

[57] ABSTRACT

A semiconductor device has the following components: a semiconductor substrate; a first region of a first conductivity type which is formed in the surface of the semiconductor substrate; a second region of a second conductivity type which is formed adjacent to the first region, in the surface of the semiconductor substrate; a first electrode which is formed on the first region; and a second electrode which is formed on the second region, the first electrode being so arranged as to be connected outside of the device, in accordance with a pressure contact. The first electrode comprises: a lower layer which is formed on the first region and consists of a metal capable of coming into ohmic contact with the semiconductor substrate; an intermediate layer of a hard conductive material, which layer is formed on the lower layer and is thicker than the lower layer; and an upper layer of a soft material, which layer is formed on the intermediate layer and is thinner than the intermediate layer.

11 Claims, 5 Drawing Figures

SEMICONDUCTOR DEVICE

This application is a continuation of application Ser. No. 561,976, filed Dec. 16, 1983, now abandoned.

BACKGROUND OF THE INVENTION

The present invention relates to a semiconductor device having a pressure contact structure and, more particularly, to an improvement of a semiconductor device, such as a transistor, gate turn-off thyristor or high speed thyristor, having a structure wherein main electrodes and control electrodes of a semiconductor device are alternately formed.

In general, the wiring or electrode layer of a semiconductor device is comprised of aluminum of high conductivity. However, since aluminum is soft and has a low melting point, it cannot always be used as the most suitable electrode material in the pressure contact structure of a high powered semiconductor device, as will be explained later. Therefore, the material and process employed in manufacturing such a pressure contact structure of a high powered semiconductor device must be properly selected, from a different point of reference than in the case of a low powered semiconductor device.

FIG. 1 is a sectional view showing the structure of a planar type power transistor, as one example of a power semiconductor device.

Referring to FIG. 1, reference numeral 1 denotes a ceramic case; 2, an npn transistor; 3 and 4, heat buffer plates made of Mo or W, respectively; and 5 and 6, Cu external electrodes, respectively. The external electrode 5 is brought into pressure contact with each of a plurality of emitter electrodes 7, through the heat buffer plate 4. The external electrode 6 is connected to a substrate 8 of the transistor 2, through the heat buffer plate 3. The substrate 8 is bonded to the heat buffer plate 3 through a bonding metal layer 11 such as a solder. One of a plurality of base electrodes 9 of the transistor 2 is connected to a lead 10. The lead 10 extends outside the ceramic case 1.

In the power transistor having the structure described above, the emitter electrodes 7 are made of an Al film having a thickness of 10 $\mu$m. These emitter electrodes 7 are formed on a plurality of emitter regions which protrude upward from the transistor 2 having a diameter of about 40 mm. The emitter electrodes 7 are brought into pressure contact with the heat buffer plate 4 at a pressure level of about 1.0 to 1.5 tons. The emitter electrodes 7 have a level difference of about 20 $\mu$m with respect to the base electrodes 9. The emitter electrodes 7 and the base electrodes 9 are alternately formed in such a way that the emitter electrodes 7 are spaced from about 200 to 300 $\mu$m apart from each other in the direction of the width.

However, in the power semiconductor device described above, although the Al emitter electrodes 7 and the external electrode 5 have the heat buffer plate 4 sandwiched therebetween, the emitter electrodes 7 are affected by heat fatigue, due to a heat cycle of intermittent operation of the transistor. As a result, any or several of the emitter electrodes 7 may be inclined in the transverse direction and, hence, may extend through a passivation film (not shown) formed on the base electrodes 9 and reach the corresponding base electrode 9. Such an emitter electrode 7 then fusion bonds to the corresponding base electrode 9. As a result, the base and the emitter regions are short-circuited.

SUMMARY OF THE INVENTION

One object of the present invention is to provide a semiconductor device having an improved pressure contact structure which prevents a short circuit between active regions as a result of the heat fatigue of an electrode.

In order to achieve the above object, a semiconductor device is provided which comprises: a semiconductor substrate; a first region of a first conductivity type which is formed in the surface of the semiconductor substrate; a second region of a second conductivity type which is formed adjacent to the first region, in the surface of the semiconductor substrate; a first electrode formed on the first region; and a second electrode formed on the second region, the first electrode being so arranged as to be connected outside of the device, in accordance with a pressure contact. The first electrode comprises: a lower layer which is formed on the first region and consists of a metal capable of coming into ohmic contact with the semiconductor substrate; an intermediate layer of a hard conductive material which is formed on the lower layer and is thicker than the lower layer; and an upper layer of a soft material which is formed on the intermediate layer and which is thinner than the intermediate layer.

The lower layer can comprise Al, Ag, or an Al/poly-Si two-layered structure, and preferably has a thickness of from 0.5 to 3 $\mu$m.

The intermediate layer can comprise: a hard metal having a high melting point, such as Mo, Ti, W and Co; or, a silicide, or a nitride thereof. The thickness of the intermediate layer is preferably from 4 to 15 $\mu$m.

The upper layer can comprise Al, Ag or the like and preferably has a thickness of from 0.5 to 3 $\mu$m.

The above-mentioned layers can be formed by vacuum evaporation, sputtering or the like.

DETAILED DESCRIPTION OF THE PREFERRED EMBODIMENTS

Figure 1:
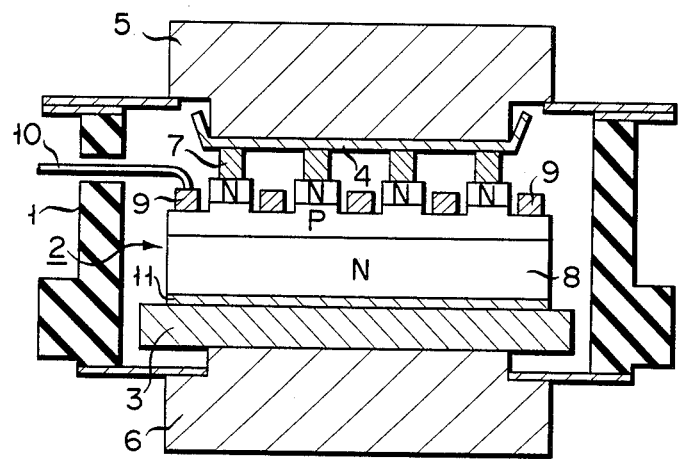
FIG. 1 is a sectional view of a conventional power transistor.

Various embodiments of the present invention may now be described with reference to the accompanying drawings. The same reference numerals which were used in FIG. 1 denote the same parts throughout FIGS. 2 to 5.

Figure 2:
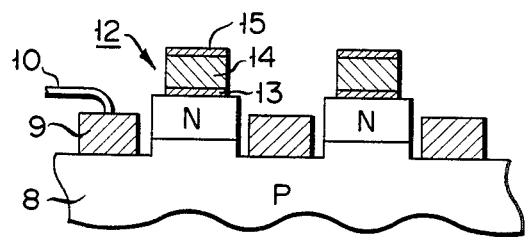
FIG. 2 is a sectional view of a power transistor according to an embodiment of the present invention.

In the power transistor shown in FIG. 2, n-type impurity regions (i.e., an emitter region) protrude upward from a p-type impurity region (i.e., a base region). Each emitter electrode 12 has a three layered structure consisting of an Al lower layer 13 having a thickness of 1 $\mu$m, an Mo intermediate layer 14 having a thickness of 10 $\mu$m, and an Al upper layer 15 having a thickness of 1 μm. According to the emitter electrode having the structure described above, the greater part of the electrode is made of a hard material having a high melting point. Even if the emitter electrode is brought into pressure contact with an external electrode at a considerably high pressure and at a high temperature level, electrode softening or deformation will not occur. Furthermore, even if the heat cycle adversely affects the emitter electrode, this electrode will not be affected by heat fatigue. Unlike the conventional device, the emitter and the base regions will not be short-circuited. The lower layer formed on the emitter region is made of a metal which comes into ohmic contact with the substrate (i.e., the emitter region), so that an ohmic contact voltage drop can be kept as low as in the case of the conventional single Al layer. In addition to this advantage, the upper layer, which is in pressure contact with the external electrode through the heat buffer plate, is made of a soft metal, so that the contact thermal resistance can be kept as low as in the conventional case of the Al single layer.

The present invention can be effectively applied in cases wherein the first impurity region of one conductivity type, which is led out by the pressure contact to an external area, is divided into a plurality of small island regions, with the second impurity region of the other conductivity type being formed interdigitatingly therebetween. The present invention can also be applied in cases wherein the first impurity region does not have a plurality of island regions, but is continuous in a complex pattern, and is formed in a complementary pattern with respect to the second impurity region.

Figure 3:
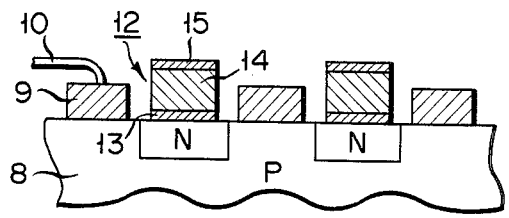
FIG. 3 is a sectional view of a power transistor according to another embodiment of the present invention.

In the power transistor shown in FIG. 3, an n-type region (i.e., an emitter region) is formed in a co-planar manner with respect to a p-type region (i.e., with respect to a collector region). In the power transistor shown in FIG. 4, a base electrode 9 is formed on the p+-type impurity region of a high impurity concentration. In any one of the power transistors of FIGS. 3 and 4, an emitter electrode 12 has the same structure as in the transistor shown in FIG. 2, thus obtaining the same effect as in FIG. 2.

Figure 4:
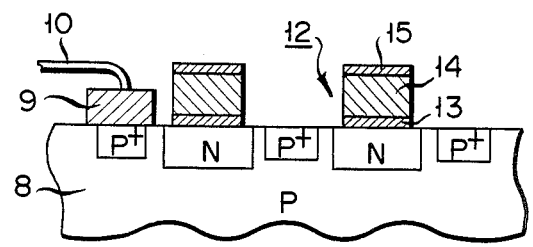
FIG. 4 is a sectional view of a power transistor according to still another embodiment of the present invention.

In the power transistors shown in FIGS. 3 and 4, the level difference between a base electrode 9 and an emitter electrode 12 is small, so that the base electrode 9 and the emitter electrode 12 are close to each other, which allows for easy contact. It is very difficult to obtain a flat surface in the conventional emitter electrode of the Al single layer. However, according to the present invention, a flat surface can be easily formed without any defect.

Figure 5:
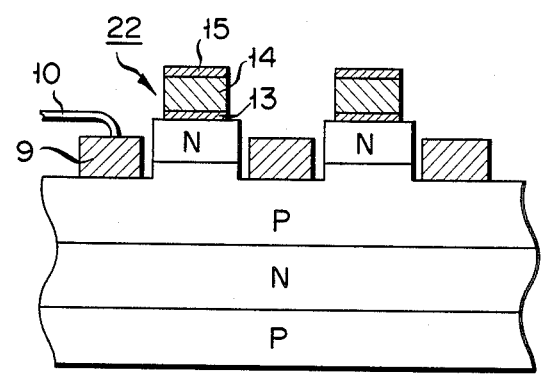
FIG. 5 is a sectional view of a thyristor according to yet another embodiment of the present invention.

FIG. 5 shows a thyristor having the electrode structure of the present invention. Electrode 22 has the same structure as the electrode 12 shown in FIG. 2, thus obtaining the same effect as in the embodiment of FIG. 2.

In the semiconductor devices according to the present invention, as may be seen from the above description, even if the internal electrode is brought into pressure contact with the external electrode under considerable pressure and at a high temperature level, the internal electrode will not be subjected to softening or deformation. The internal electrode will not suffer heat fatigue, even if a heat cycle is effected. Therefore, the internal electrode will not become inclined in the transverse direction and will not come into contact with the adjacent electrode to form a short circuit therewith.

The semiconductor device exemplified in the above embodiment, has an electrode of a three-layered structure. However, the electrode subjected to pressure contact according to the present invention need not have such a three-layered structure, since it may be extended to have a structure of four or more layers. Even in this case, however, the electrode must have such distinct lower, intermediate and upper layers.

What is claimed is:

1. A semiconductor device for electrical connection with an external electrode through pressure contact at pressures sufficiently high to obviate the need for soldering or otherwise bonding the semiconductor device to the external electrode, the semiconductor device comprising:

a semiconductor substrate; a first region of first conductivity type which is formed in the surface of said semiconductor substrate; a second region of a second conductivity type which is formed in said surface of said semiconductor substrate adjacent to said first region; a first electrode formed on said first region for pressure contact with the external electrode; and a second electrode formed on said second region;

said first electrode of said semiconductor device including:

a relatively thin lower layer having a thickness of 0.5 to 3 μm formed on said first region and made of a member selected from the group consisting of aluminum, gold and an aluminum/poly-silicon two-layered structure; an intermediate layer having a thickness of 4 to 15 μm formed on said lower layer and made of a member selected from the group consisting of molybdenum, titanium, tungsten, cobalt, a silicide thereof and a nitride thereof, said intermediate layer being substantially thicker than said lower layer; and a relatively thin upper layer of conductive material having a thickness of 0.5 to 3 μm formed on said intermediate layer for engaging in pressure contact the external electrode, said upper layer being thinner than said intermediate layer and being formed of a metal selected from the group consisting of aluminum and gold.

2. A semiconductor device for electrical connection with an external electrode through pressure contact at pressures sufficiently high to obviate the need for soldering or otherwise bonding the semiconductor device to the external electrode, the semiconductor device comprising:

a semiconductor substrate; a first region of a first conductivity type which is formed in the surface of said semiconductor substrate; a second region of a second conductivity type which is formed in said surface of said semiconductor substrate adjacent to said first region, a first electrode formed on said first region for pressure contact with the external electrode; and a second electrode formed on said second region;

said first electrode of said semiconductor device including:

a relatively thin lower layer having a thickness of 0.5 to 3 μm formed on said first region and consisting of a conductive metal in ohmic contact with said semiconductor substrate to minimize voltage drop between said lower layer and said semiconductor substrate; an intermediate layer having a thickness of 4 to 15 μm on said lower layer and consisting of a conductive material resistant to electrode softening or deformation when subjected to high pressures, high temperatures or heat failure; and a relatively thin upper layer having a thickness of 0.5 to 3 μm formed on said intermediate layer for engaging in pressure conduct the external electrode, said upper layer being formed of a conductive metal which is sufficiently soft to minimize the contact thermal resistance between said upper layer and the external electrode.

3. A device according to claim 1 or 2, wherein said first region comprises a plurality of island regions.

4. A device according to claim 1 or 2, wherein said first region comprises a complex pattern.

5. A device according to claim 1 or 2, wherein said first region is so formed as to extend upward from said semiconductor substrate, and extends to a level higher than that of said second region.

6. A device according to claim 1 or 2, wherein said first region extends to the same level as that of said second region.

7. A device according to claim 1 or 2, wherein said semiconductor device is a bipolar transistor.

8. A device according to claim 1 or 2, wherein said semiconductor device is a thyristor.

9. A semiconductor device according to claim 1 or 2, wherein said lower layer has a thickness of approximately 1 μm, said intermediate layer has a thickness of approximately 10 μm, and said upper layer has a thickness of approximately 1 μm.

10. The semiconductor device according to claim 1 or 2, wherein said intermediate layer is at least seven times thicker than said lower layer and is at least seven times thicker than said upper layer.

11. The semiconductor device according to claim 10, wherein said lower layer is made of Al, said intermediate layer is made of Mo, and said upper layer is made of Al.

* * * * *

UNITED STATES PATENT AND TRADEMARK OFFICE
CERTIFICATE OF CORRECTION

PATENT NO. : 4,724,475

DATED : February 9, 1988

INVENTOR(S) : Hideo Matsuda

It is certified that error appears in the above-identified patent and that said Letters Patent is hereby corrected as shown below:

Title Page, under "Assignee:" change "Kabushiki Kaisha Toshiba" to --Tokyo Shibaura Denki Kabushiki Kaisha--.

Signed and Sealed this

Eleventh Day of October, 1988

*Attest:*

DONALD J. QUIGG

*Attesting Officer*  *Commissioner of Patents and Trademarks*